(12) United States Patent
Sekiya et al.

(10) Patent No.: US 7,731,567 B2
(45) Date of Patent: Jun. 8, 2010

(54) SEMICONDUCTOR WAFER PROCESSING METHOD

(75) Inventors: Shinnosuke Sekiya, Ota-ku (JP); Setsuo Yamamoto, Ota-ku (JP); Naoya Sukegawa, Ota-ku (JP); Naruto Fuwa, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/903,041

(22) Filed: Sep. 20, 2007

(65) Prior Publication Data

US 2008/0076329 A1    Mar. 27, 2008

(30) Foreign Application Priority Data

Sep. 26, 2006   (JP)   ............... 2006-260521

(51) Int. Cl.
*B24B 1/00*   (2006.01)
(52) U.S. Cl. .............. 451/11; 451/41; 451/63; 451/287; 257/E21.237
(58) Field of Classification Search .......... 451/11, 451/41, 57, 58, 63, 285, 287; 257/E21.237, 257/E21.214; 438/692, 959
See application file for complete search history.

(56) References Cited

U.S. PATENT DOCUMENTS

| 2004/0137698 A1* | 7/2004 | Taraschi et al. ............. 438/458 |
| 2005/0142815 A1* | 6/2005 | Miyazaki et al. ............ 438/464 |
| 2007/0004180 A1* | 1/2007 | Abe ........................... 438/460 |

FOREIGN PATENT DOCUMENTS

| JP | 2003-173987 | 6/2003 |
| JP | 2005-123425 | * 5/2005 |

* cited by examiner

*Primary Examiner*—Eileen P. Morgan
(74) *Attorney, Agent, or Firm*—Greer, Burns & Crain, Ltd

(57) ABSTRACT

In a semiconductor wafer processing method of forming a semiconductor wafer having a desired thickness by grinding a rear surface of the semiconductor wafer having a plurality of devices formed on a front surface thereof, the rear surface of the semiconductor wafer is ground so that the semiconductor wafer has a thickness of 10 μm to 100 μm, and a strain layer having a thickness of 0.05 μm to 0.1 μm is left on the rear surface of the semiconductor wafer by the grinding. The strain layer is left to provide the gettering effect, preventing a harmful influence exerted on the quality of the semiconductor devices. Degradation in transverse rupture strength can be prevented by the grinding.

3 Claims, 11 Drawing Sheets

SEMICONDUCTOR WAFER PROCESSING METHOD

BACKGROUND OF THE INVENTION

1. Field of the Invention

The present invention relates to a semiconductor wafer-processing method of grinding the rear surface of a semiconductor wafer to form the semiconductor wafer having a desired thickness.

2. Description of the Related Art

A semiconductor wafer having a plurality of semiconductor devices such as integrated circuits and the like formed on the front surface thereof is formed to have a desired thickness by grinding the rear surface thereof and then is dividedly diced into the individual semiconductor devices. In particular, to meet the requirements of downsizing and thickness reduction of electronics, in recent years it has been required that semiconductor devices be formed to have a thickness of as extremely thin as 100 µm or less, or 50 µm or less by efficiently grinding the rear surface of the semiconductor wafer.

If the rear surface of the semiconductor wafer is ground, it is formed with a strain layer with micro cracks having a thickness of about 0.5 µm. This strain layer causes the transverse rupture strength of the semiconductor device to deteriorate. If the semiconductor wafer is formed extremely thin, also the strain layer causes the semiconductor wafer to crack or chip. Therefore, after the rear surface of the semiconductor wafer is ground, the strain layer is removed by polishing, wet etching, or dry etching the rear surface to prevent the degradation in transverse rupture strength (see e.g. Japanese Patent Laid-open No. 2003-173987).

However, for semiconductor wafers formed with a plurality of semiconductor wafers such as e.g. DRAMs having a refresh (data-retaining) function, when the strain layer was removed by polishing, wet etching, or dry etching after grinding of the rear surface, there arose a problem of a degraded data-retaining function. This problem may probably be caused by the following. Metal atoms such as copper or the like contained inside a semiconductor device in a semiconductor fabrication process exist close to the rear surface due to the gettering effect before the removal of the strain layer on the rear surface. However, if the strain layer is removed by polishing the rear surface, the gettering effect is degraded and the metal atoms freely move to the front surface side formed with the semiconductor devices thereon.

SUMMARY OF THE INVENTION

It is an object of the invention to provide a semiconductor wafer processing method of forming a semiconductor wafer with a desired thickness by not degrading the transverse rupture strength of the semiconductor device and causing the gettering effect to exert no harmful influence on the quality of the semiconductor device.

In accordance with an aspect of the present invention, there is provided a semiconductor wafer processing method for forming a semiconductor wafer having a desired thickness by grinding a rear surface of the semiconductor wafer having a plurality of devices formed on a front surface thereof, in which the rear surface of the semiconductor wafer is ground so that the semiconductor wafer has a thickness of 10 µm to 100 µm and a strain layer having a thickness of 0.05 µm to 0.1 µm is left on the rear surface of the semiconductor wafer by the grinding.

Preferably, the grinding is performed by using a grind stone containing abrasive grains having a grain diameter of 0.01 µm to 0.2 µm. Not only the entire rear surface of the semiconductor wafer is ground but also a rear surface of an area where the plurality of the devices are formed is ground to form a ring-like reinforcing portion on an outer circumferential side of the area. Examples of the semiconductor wafer include a silicon wafer.

According to the invention, the rear surface of the semiconductor wafer is ground so that the semiconductor wafer has a final thickness of 10 µm to 100 µm. The strain layer having a thickness of 0.01 µm to 0.2 µm based on the observation under a transmission electron microscope is formed on the rear surface of the semiconductor wafer. Thus, the gettering effect is enhanced and the semiconductor device can have a transverse rupture strength of 1000 MPa or more on an average and of 500 MPa or more at minimum.

The above and other objects, features and advantages of the present invention and the manner of realizing them will become more apparent, and the invention itself will best be understood from a study of the following description and appended claims with reference to the attached to the drawings showing some preferred embodiments of the invention.

DETAILED DESCRIPTION OF THE PREFERRED EMBODIMENTS

Figure 1:
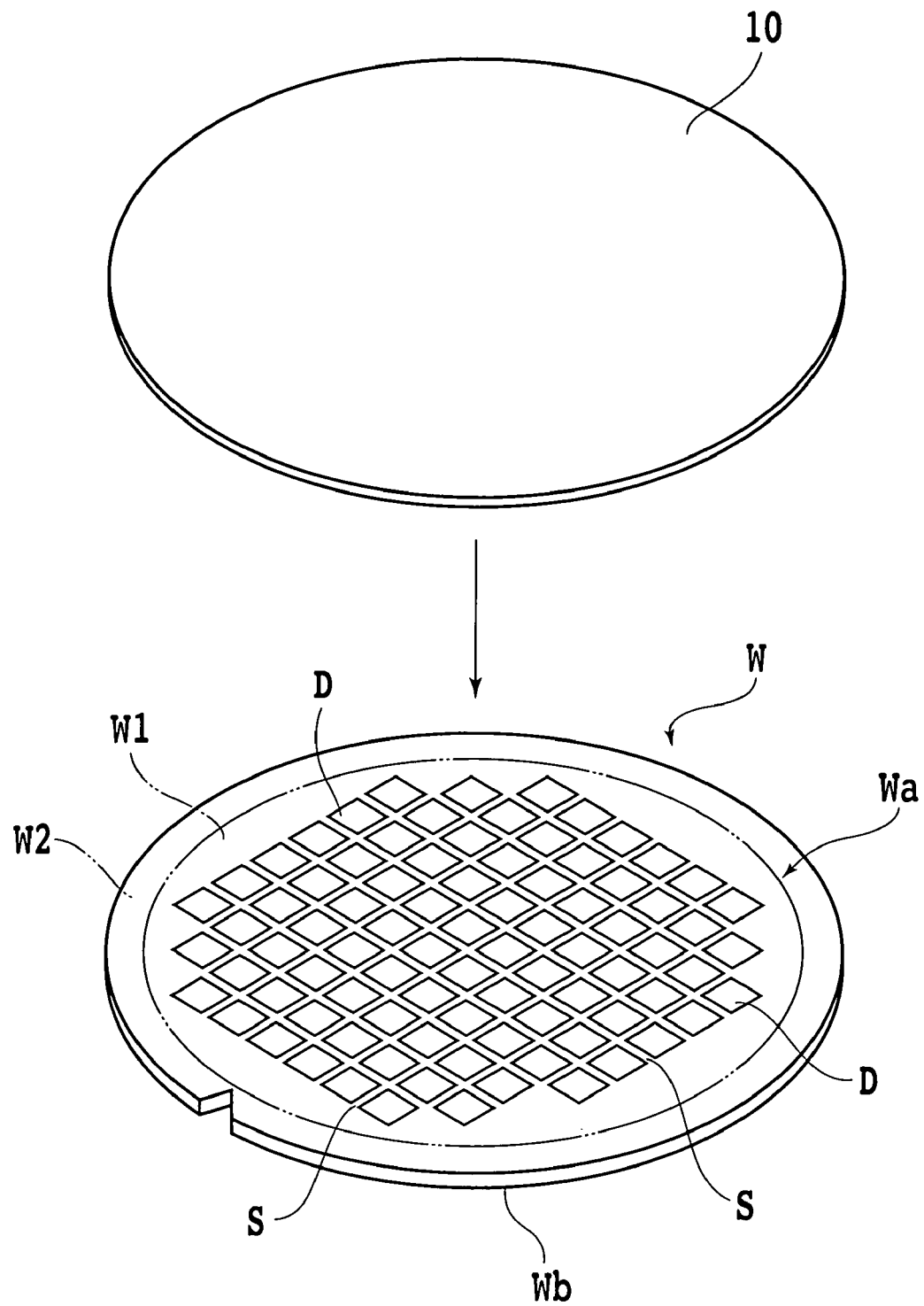
FIG. 1 is a perspective view of a semiconductor wafer and a protection member by way of example.

A semiconductor wafer W shown in FIG. 1 is a silicon wafer. Its front surface Wa is sectioned by streets S lengthwise and breadthwise into a plurality of semiconductor devices D each having a date-retaining function such as e.g. a DRAM (dynamic Random Access Memory). An area formed with the semiconductor devices D constitutes a device area W1, which is surrounded by an outer circumferential redundant area W2.

Figure 2:
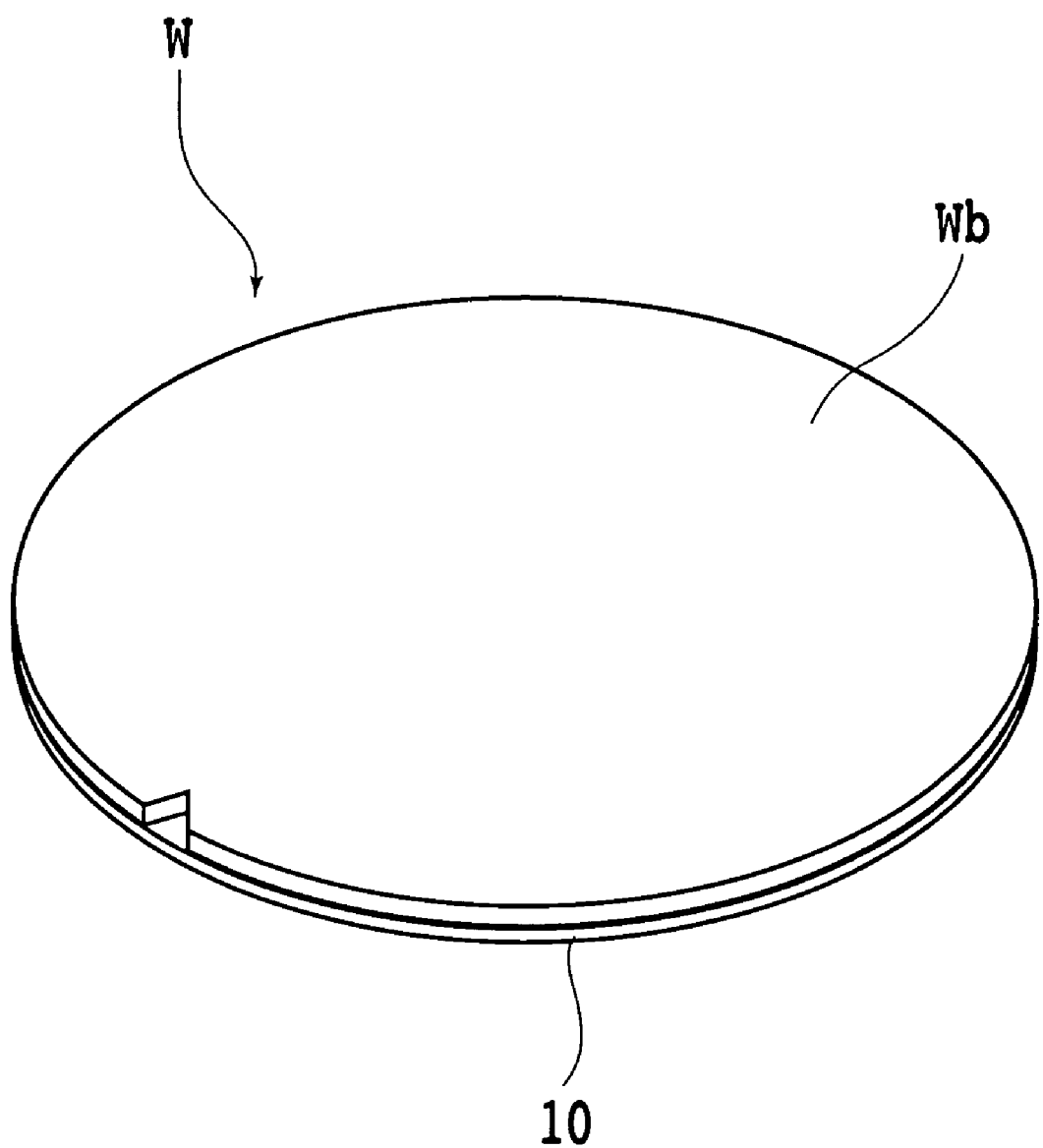
FIG. 2 is a perspective view illustrating a state where the protection member is stuck to the front surface of the semiconductor wafer.

The semiconductor wafer W is formed to have a desired thickness by grinding a rear surface Wb thereof. Before the grinding of the rear surface Wb, a protection member 10 used to protect the semiconductor devices D is stuck on the front surface Wa of the semiconductor wafer W, resulting in a state shown in FIG. 2. A grinding apparatus 1 shown in FIG. 3 for instance is used to grind the rear surface Wb of the semiconductor wafer W. This grinding apparatus 1 includes a chuck table 2 which holds and rotates the semiconductor wafer W and a grinding device 3 which grinds the semiconductor wafer W held by the chuck table 2. The grinding device 3 is driven by a grinding-transfer device 4 to ascend and descend.

Figure 4:
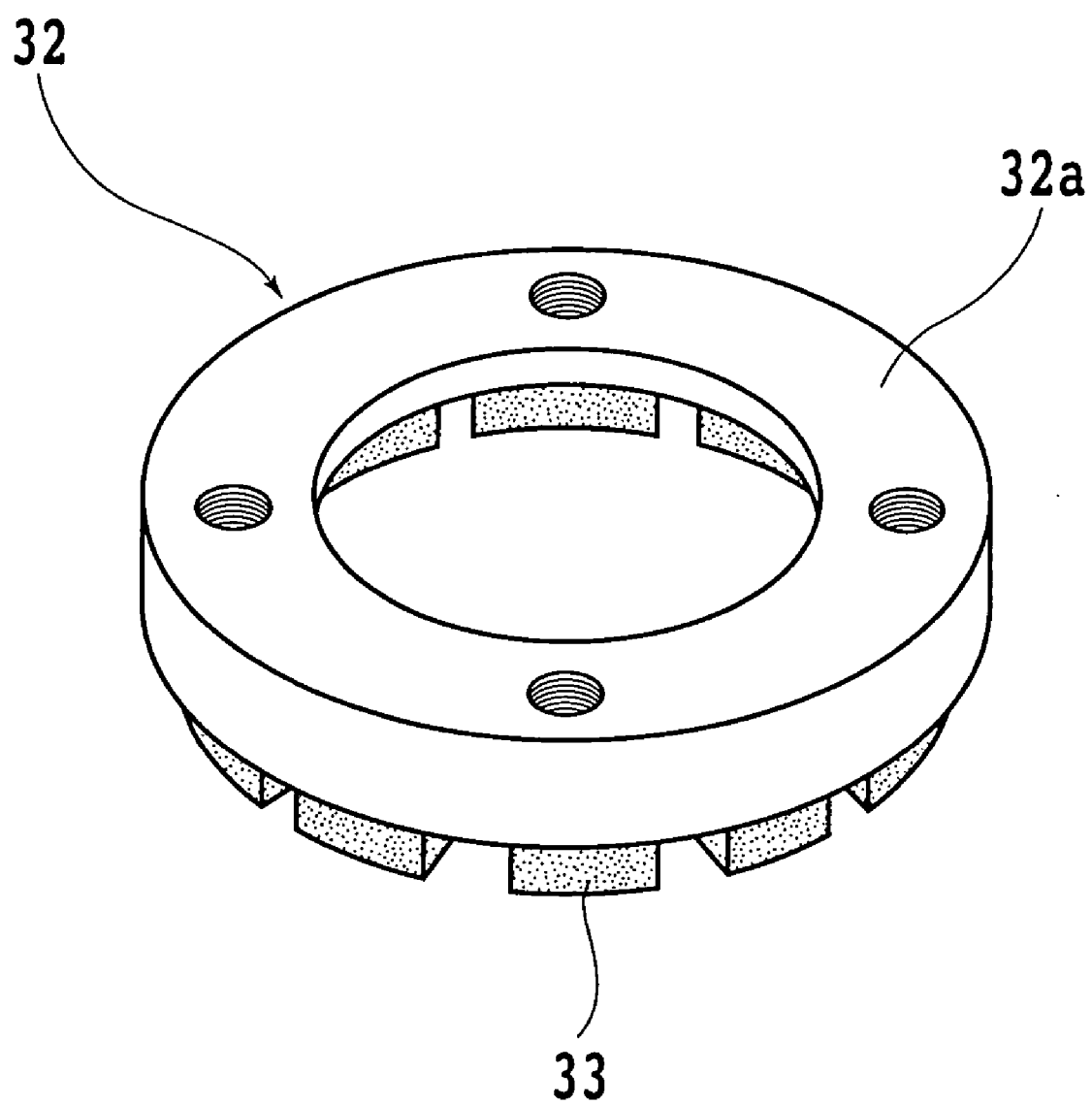
FIG. 4 is a perspective view of a grinding wheel according to a first example.

The chuck table 2 is rotatably supported by a travel base 20 and is configured to move in the same direction as the travel base 20 moves horizontally along with the extension and contraction of bellows 21. The grinding device 3 includes a spindle 30 having a vertical axis; a wheel mount 31 attached to the lower end of the spindle 30; and a grinding wheel 32 configured such that a plurality of grindstones 33 are secured to the end face of the ring-like base 32a by a bond such as an epoxy resin or the like as shown in FIG. 4. Each grindstone 33 is formed by mixing, with a vitrified bond, abrasive grains such as diamond, CBN (cubic boron nitride), WA, or GC with a grain diameter of 0.01 μm to 0.2 μm at a volume ratio of 30% and sintering the mixture at temperature of about 1200° C.

Figure 3:
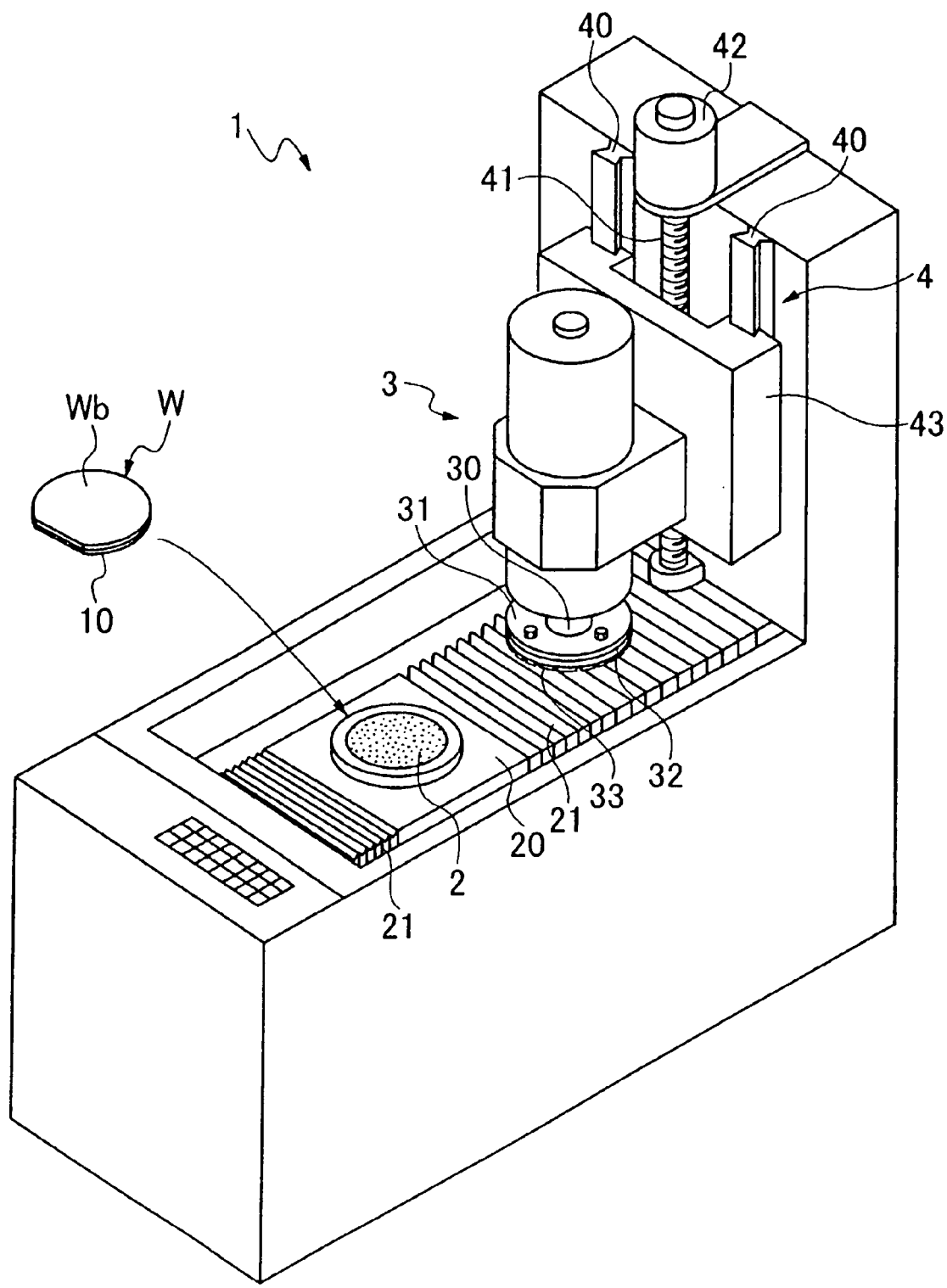
FIG. 3 is a perspective view of a grinding apparatus according to a first example.

As shown in FIG. 3, the grinding-transfer device 4 includes guide rails 4 and a ball screw 41 arranged to extend vertically; a drive source 42 connected to the ball screw 41; and an elevating plate 43 which slidably contacts the guide rails 40 and whose internal nut is threadedly engaged with the ball screw 41. The elevating plate 43 is guided by the guide rails 40 and moves up and down along with turning of the ball screw 41 driven by the drive source 42 and also the grinding device 3 secured to the elevating plate 43 moves up and down.

Figure 5:
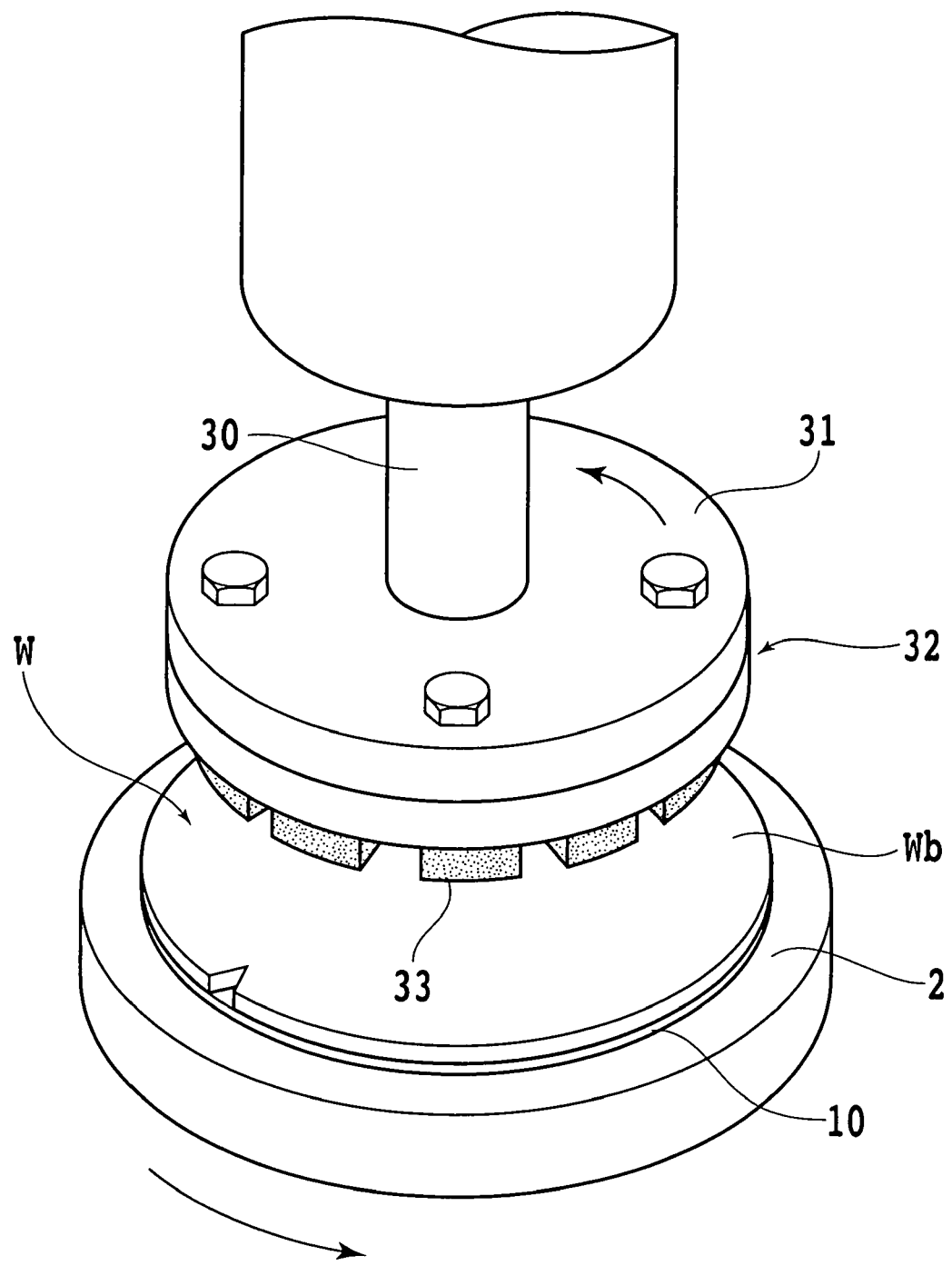
FIG. 5 is a perspective view illustrating a state where the rear surface of the semiconductor wafer is ground.

Referring to FIG. 5, the grinding wheel 32 is secured to the wheel mount 31 with screws. When the rear surface Wb of the semiconductor wafer W is ground, on the side of the protection member 10 stuck to the semiconductor wafer W is held by the chuck table 2. With the rear surface Wb of the wafer W opposed to the grindstones 33, the chuck table 2 and the grinding wheel 32 are rotated in directions opposite to each other. The semiconductor wafer W is rotated along with the rotation of the chuck table 2 and the grindstones 33 rotated along with the rotation of the grinding wheel 32 are brought into contact with the rear surface Wb of the semiconductor wafer W for grinding.

Figure 6:
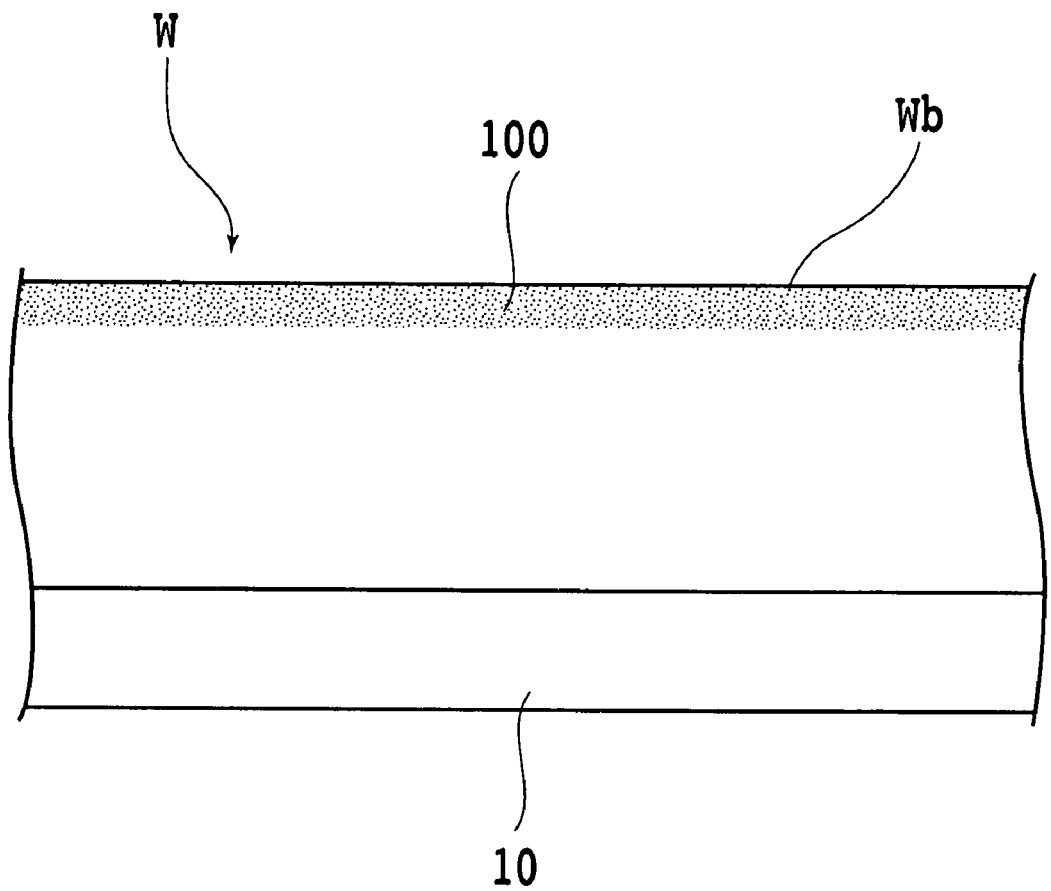
FIG. 6 is an enlarged front view illustrating the semiconductor wafer formed with a strain layer on the rear surface, and the protection member.

In this case, the chuck table 2 is rotated at 200 rpm to 300 rpm and the grinding wheel 32 is rotated at 2000 rpm to 6000 rpm. In addition, the grindstones 33 are pressed against the rear surface Wb of the semiconductor wafer W by allowing the grinding-transfer device 4 shown in FIG. 4 to downwardly move the grinding device 3 at a transfer speed of 0.05 μm/sec to 0.5 μm/sec, preferably 0.15 μm/sec. Thus, the grinding is performed until the thickness of the semiconductor wafer W becomes 10 μm to 100 μm. As a result, it was observed under a transmission electron microscope, as shown in FIG. 6, that a strain layer 100 having a thickness of 0.01 μm to 0.2 μm was formed on the rear surface Wb of the semiconductor wafer W. In this way, enough gettering effect not to degrade the quality of a device D could be provided. In addition, it was confirmed that the transverse rupture strength of the semiconductor wafer W in this case was 500 MPa or more at minimum and at 1000 MPa or more on an average although depending on the final thickness.

Figure 7:
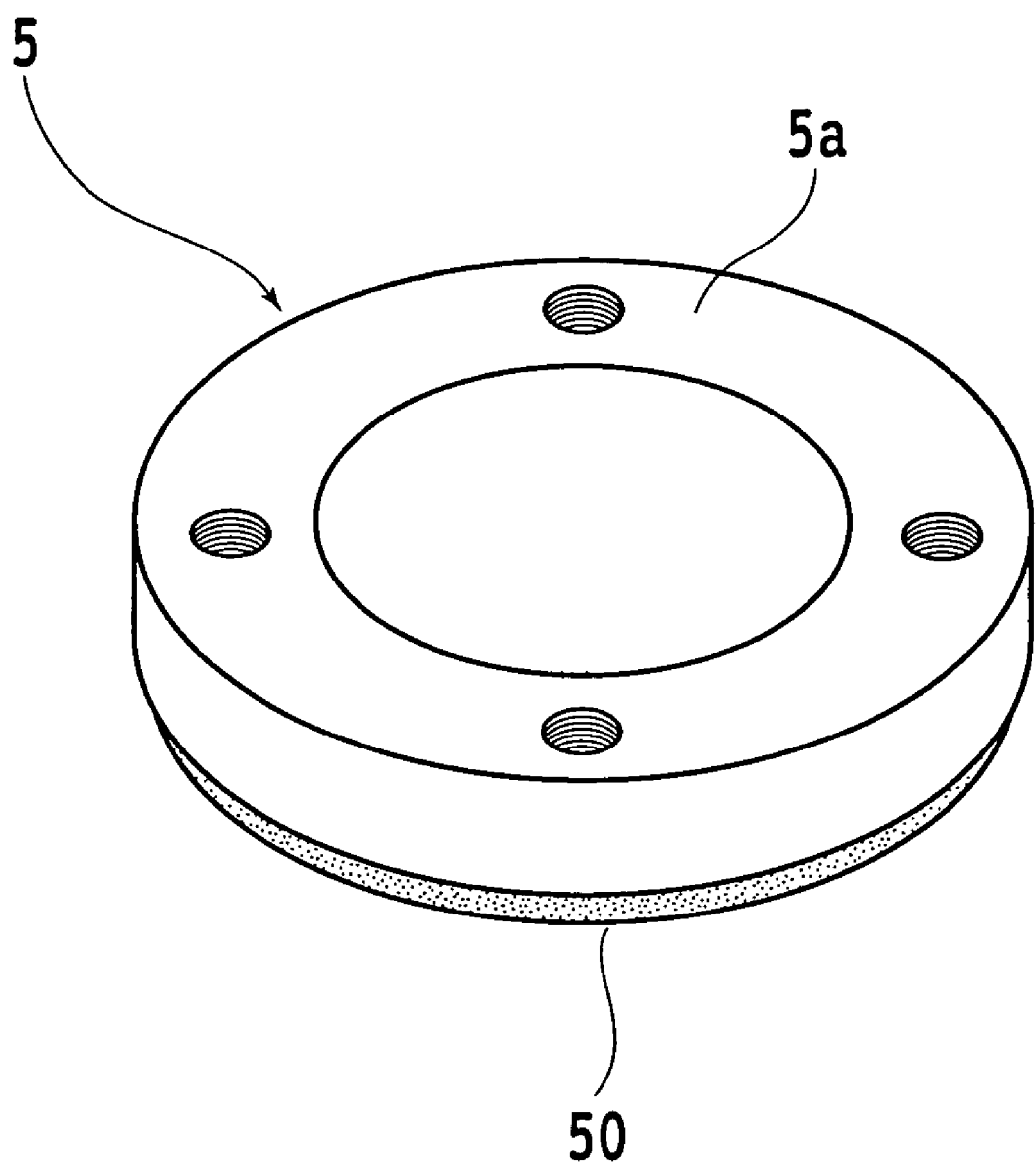
FIG. 7 is a perspective view of a grinding wheel according to a second example.

A grinding wheel 5 shown in FIG. 7 can be used instead of the grinding wheel 32 shown FIGS. 4 and 5. The grinding wheel 5 is configured such that a grindstone 50 is secured to an end face of a circular base 5a with a bond such as an epoxy resin or the like. This grinding wheel 5 is secured to the wheel mount 31 with screws. The grindstone 50 is formed like a disk by mixing, with a polymer material such as felt, abrasive grains such as diamond, CBN, WA, or GC with a grain diameter of 0.01 μm to 0.2 μm at a volume ratio of 30% and sintering the mixture at a temperature of about 1200° C.

As with the case of FIG. 5, the rotating grindstone 50 is brought into contact with and pressed against the rear surface Wb of the semiconductor wafer W for grinding while rotating the chuck table 2 along with the grindstone 50. In this case, the chuck table 2 is rotated at 100 rpm or less, the grindstone 50 is rotated at 2000 rpm to 6000 rpm, and a load of 100 N to 400 N is applied to the semiconductor wafer W for pressing by the grinding-transfer device 4. Thus, the semiconductor wafer W is ground to a desired thickness. It was confirmed through the observation under a transmission electron microscope that a strain layer having a thickness of 0.01 μm to 0.2 μm was formed on the rear surface Wb of the semiconductor wafer W. In this way, enough gettering effect not to degrade the quality of a semiconductor device could be provided. In addition, it was confirmed that the transverse rupture strength of the semiconductor wafer W in this case was 500 MPa or more at minimum and 1000 MPa or more on an average although depending on the final thickness.

Incidentally, productivity is enhanced by the following processes. Before the grinding as in the two examples described above, the rear surface Wb of the semiconductor wafer W is ground by a grindstone containing diamond abrasive grains having a grain diameter of about 2 μm to 4 μm to form the semiconductor wafer W having a thickness of e.g. about 12 μm to 102 μm, which is slightly thicker than the desired thickness. Thereafter, the grinding is performed described above to remove a thickness of about 2 μm, providing the desired thickness. Thus, a strain layer having a thickness of 0.01 μm to 0.1 μm is left.

Figure 8:
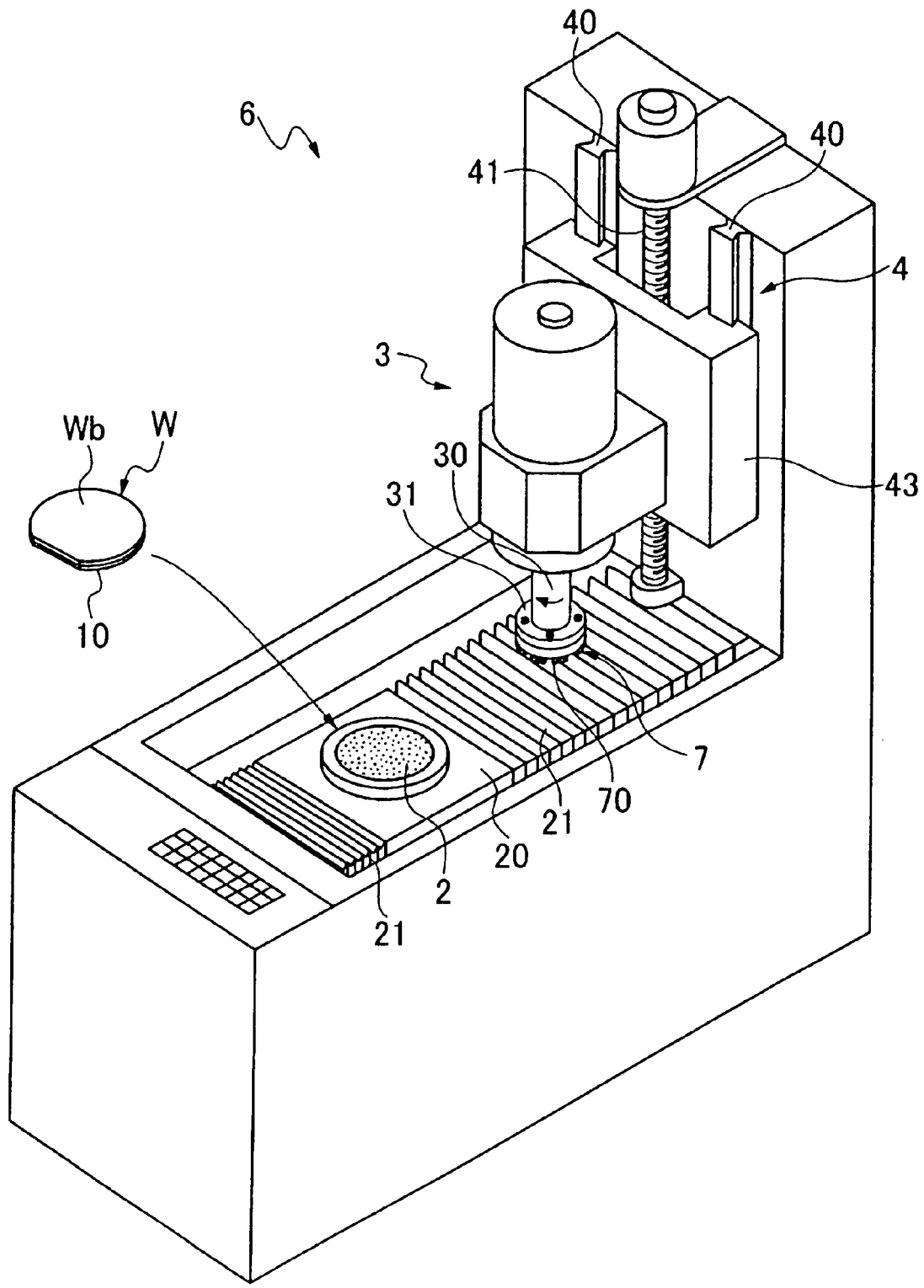
FIG. 8 is a perspective view of a grinding apparatus according to a second example.

A description is next made of a case where a grinding apparatus 6 shown in FIG. 8 is used to grind only the rear surface of the device area D of the semiconductor wafer W shown in FIG. 1. The grinding apparatus 6 is configured to differ from the grinding apparatus 1 shown in FIG. 3 in only the configuration of the grinding wheel. Examples of a grindstone attached to the wheel mount 31 in the grinding apparatus 6 include a grinding wheel 7 shown in FIG. 9 and a grinding wheel 8 shown in FIG. 10.

Figure 9:
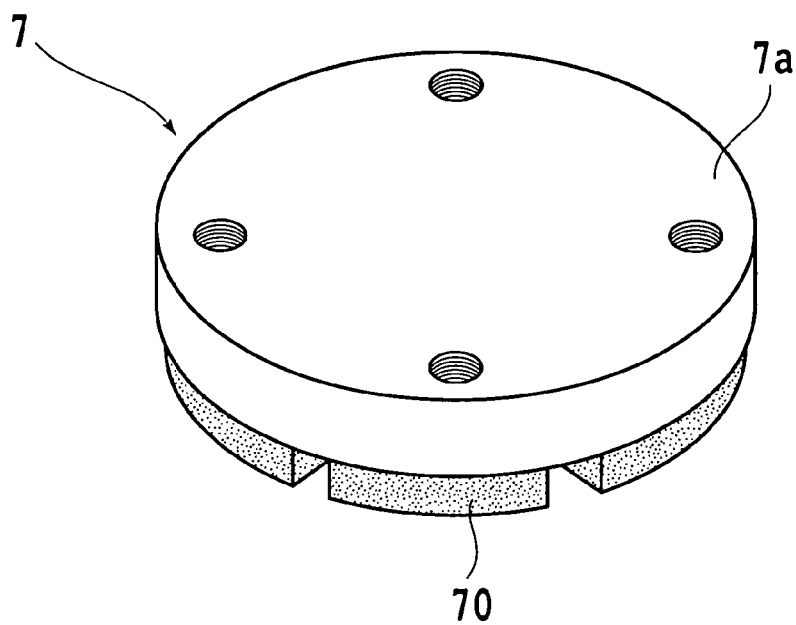
FIG. 9 is a perspective view of a grinding wheel according to a third example.

The grinding wheel 7 shown in FIG. 9 includes a base 7a and a plurality of grindstones 70 secured to the base 7a in circular arrangement. Each grindstone 70 is formed by mixing, with a vitrified bond, abrasive grains such as diamond, CBN (cubic boron nitride), WA, or GC with a grain diameter of 0.01 to 0.2 μm at a volume ratio of 30% and sintering the mixture at temperature of about 1200° C. The grindstones 70 thus formed are secured to an end face of the base 7a with a bond such as an epoxy resin or the like. The grindstone 70 is formed such that the diameter of the outmost circumference of the rotational trajectory is greater than the radius of the device area W1 shown in FIG. 1 and smaller than the diameter of the device area W1 and the diameter of the innermost circumference of the rotational trajectory is smaller than the radius of the device area W1. The grinding wheel 7 is secured to the wheel mount 31 with screws.

Figure 10:
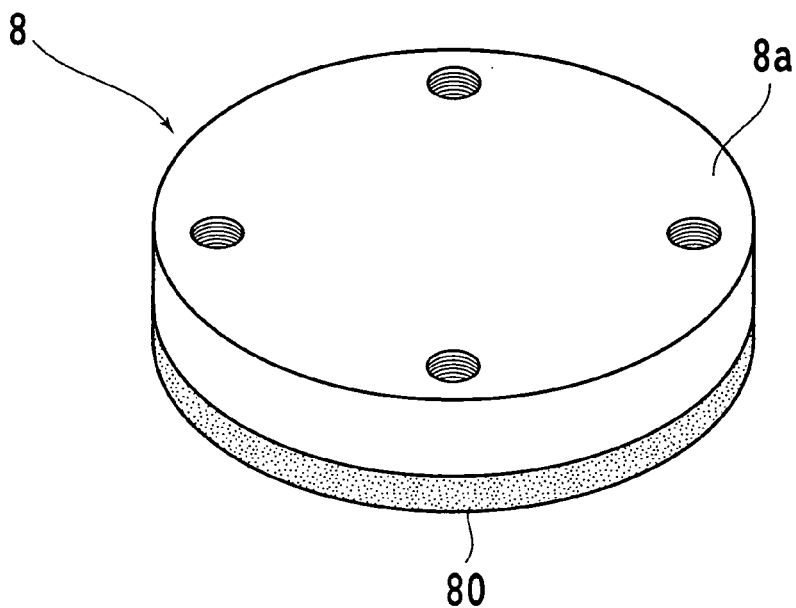
FIG. 10 is a perspective view of a grinding wheel according to a fourth example.

The grinding wheel 8 shown in FIG. 10 includes a circular base 8a and a grindstone 80 secured to an end face of the base 8a with a bond such as an epoxy resin or the like. The grindstone 80 is formed like a disk by mixing, with varnish, abrasive grains such as diamond, CBN, WA, or GC with a grain diameter of 0.01 to 0.2 μm at a volume ratio of 30%, impregnating the mixture into a polymer material such as felt and sintering it at temperature of about 1200° C. The grinding wheel 8 is secured to a wheel mount 31 with screws. The grindstone 80 is formed to have a diameter greater than the radius of the device area W1 shown in FIG. 1 and smaller than the diameter of the device area W1.

Figure 11:
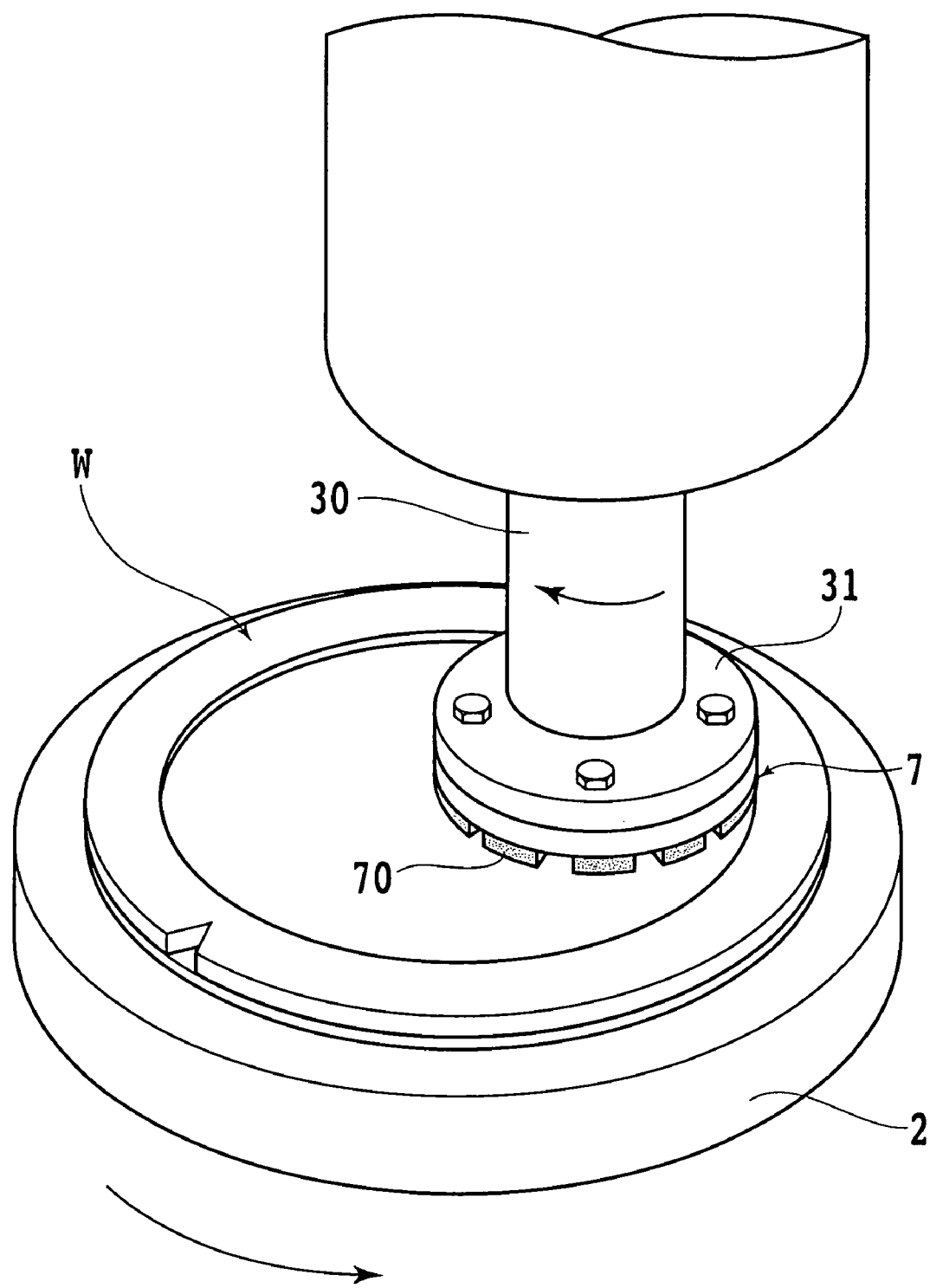
FIG. 11 is a perspective view illustrating a state where the rear surface of a device area on the rear surface of the semiconductor wafer is ground.

For example, if the rear, surface Wb of the semiconductor wafer W is ground using the grinding wheel 7, the grindstone 70 is opposed to the rear surface Wb of the semiconductor wafer W as shown in FIG. 11. The chuck table 2 and the grinding wheel 7 are rotated in directions opposite to each other. The semiconductor wafer W is rotated along with the rotation of the chuck table 2. In addition, the grindstones 70 are brought into contact with only the rear surface of the device area W1 in the rear surface Wb of the semiconductor wafer W but into non-contact with the outer circumferential redundant area W2. In this way, grinding is performed. The grindstones 70 are in contact with the rotational center of the semiconductor wafer W at all times.

Figure 12:
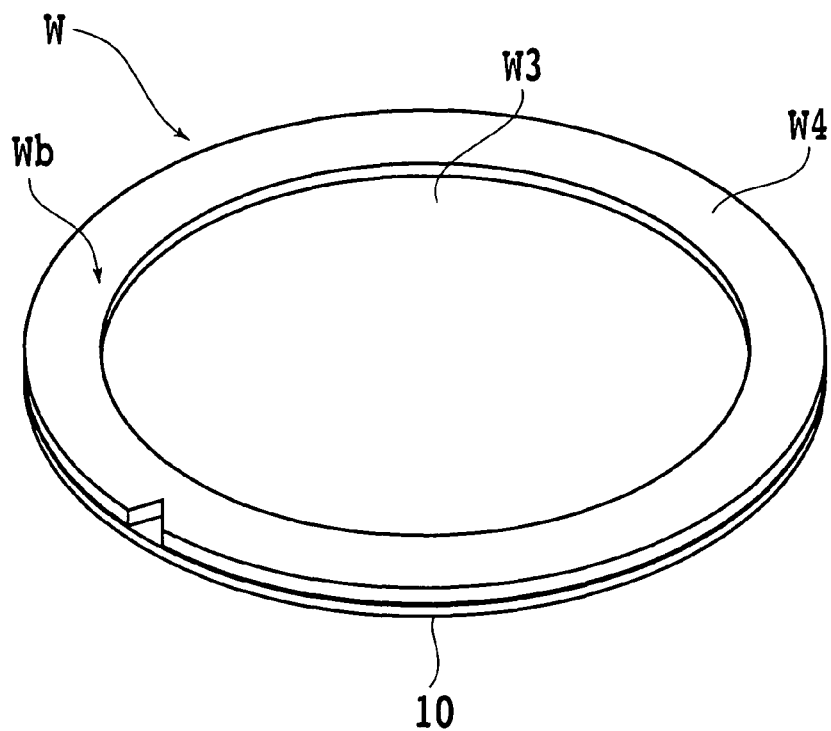
FIG. 12 is a perspective view of a semiconductor wafer formed with a recessed portion on the rear side of the device area, and a protection member.
Figure 13:
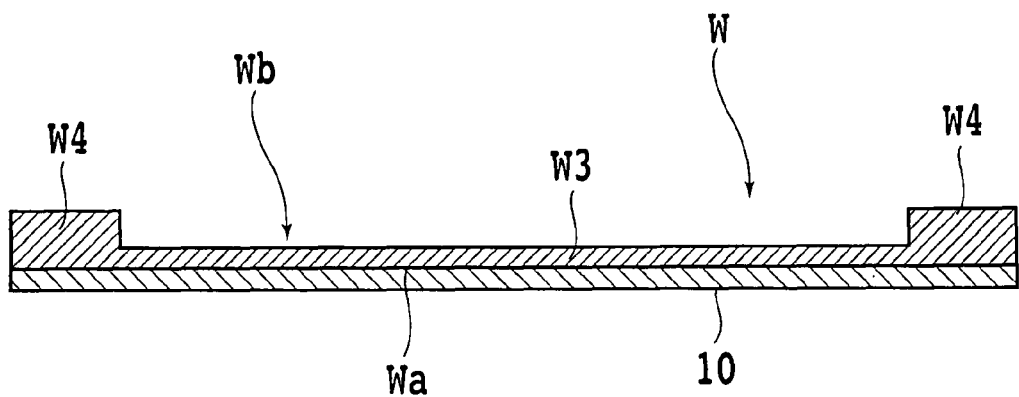
FIG. 13 is a cross-sectional view of a semiconductor wafer formed with a recessed portion on the rear side of the device area, and a protection member.

The chuck table 2 is rotated at 200 rpm to 300 rpm and the grinding wheel 7 is rotated at 2000 rpm to 6000 rpm. The grinding device 3 is moved downward by the grinding-transfer device 4 shown in FIG. 1 at a transfer speed of 0.05 μm/sec to 0.5 μm/sec, preferably, 0.15 μm/sec, thereby pressing the grindstone 70 against the rear surface Wb of the semiconductor wafer W for grinding. In this way, only the rear surface of the device area W1 of the semiconductor wafer W is ground to form a recessed portion W3 on the rear side of the device area W1 as shown in FIGS. 12 and 13 and a ring-like reinforcing portion W4 maintaining its original thickness on the outer circumferential side of the recessed portion W3. The recessed portion W3 is ground to have a thickness of 10 μm to 100 μm.

It was confirmed through the observation under a transmission electron microscope that a strain layer 100 having a thickness of 0.01 μm to 0.2 μm was formed on the rear surface of the recessed portion W3. In this way, enough gettering effect not to degrade the quality of a semiconductor device could be provided. In addition, it was confirmed that the transverse rupture strength of the semiconductor wafer W in this case was 500 MPa or more at minimum and 1000 MPa or more on an average although depending on the final thickness of the recessed portion W3. Further, since the ring-like reinforcing portion W4 maintains the thickness before the final grinding, handling of the semiconductor wafer W, such as conveyance and the like, is facilitated to prevent crack, chip, etc.

Also if the grinding wheel 8 shown in FIG. 10 is used, the grindstone 80 is opposed to the rear surface Wb of the semiconductor wafer W. The chuck table 2 and the grinding wheel 8 are rotated in directions opposite to each other. The semiconductor wafer W is rotated along with the rotation of the chuck table 2. In addition, the grindstone 80 is brought into contact with only the rear surface of the device area W1 on the rear surface Wb of the semiconductor wafer W but into non-contact with the outer circumferential redundant area W2. During the grinding, the grindstone 80 is in contact with the rotational center of the semiconductor wafer W at all times. The chuck table 2 is rotated at 100 rpm or less and the grindstone 80 is rotated at 2000 rpm to 6000 rpm. A load of 100 N to 400 N is applied to the semiconductor wafer W by the grinding-transfer device 4 for pressing. In this way, the semiconductor wafer W is ground to have a desired thickness. Consequently, as shown in FIGS. 12 and 13, the recessed portion W3 is formed on the rear side of the device area W1 and the ring-like reinforcing portion W4 maintaining its original thickness is formed on the outer circumferential side of the recessed portion W3. The grinding is performed until the recessed portion W3 has a thickness of 10 μm to 100 μm.

It was confirmed through the observation under a transmission electron microscope that a strain layer having a thickness of 0.01 μm to 0.2 μm was formed on the bottom surface of the recessed portion W3. In this way, enough gettering effect not to degrade the quality of a semiconductor device could be provided. In addition, it was confirmed that the transverse rupture strength of the semiconductor wafer W in this case was 500 MPa or more at minimum and 1000 MPa or more on an average although depending on the final thickness. Further, since the ring-like reinforcing portion W4 maintains the thickness before the final grinding, handling of the semiconductor wafer W, such as conveyance and the like, is facilitated to prevent crack, chip, etc.

Incidentally, productivity is enhanced by the following processes. Before the final grinding by the grinding wheel 7 or 8, the rear surface of the device area W1 is ground by a grindstone containing diamond abrasive grains having a grain diameter of about 2 μm to 4 μm so that the recessed portion W3 has a thickness of e.g. about 12 μm to 102 μm, which is slightly thicker than the desired thickness. Thereafter, the final grinding is performed as described above to remove a thickness of 2 μm, providing the desired thickness. Thus, a strain layer having a thickness of 0.01 μm to 0.1 μm is left.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor wafer processing method of forming a semiconductor wafer having a desired thickness by grinding a rear surface of the semiconductor wafer having a plurality of devices formed on a front surface thereof, the semiconductor wafer having a device area where the plurality of the devices are formed and a circumferential redundant area surrounding the device area, said method comprising:
   providing a semiconductor wafer having a uniform thickness throughout the entire semiconductor wafer;
   reducing an initial thickness of the semiconductor wafer by continuously grinding with a grindstone the rear surface of the semiconductor wafer so that the semiconductor wafer has a thickness of 10 μm to 100 μm, said grindstone being formed such that the diameter of the outmost circumference of the rotational trajectory is greater than the radius of the device area and smaller than the diameter of the device area, and the diameter of the innermost circumference of the rotational trajectory is smaller than the radius of the device area;
   leaving a strain layer exposed on the rear surface of the semiconductor wafer, and having a thickness of 0.05 μm to 0.1 μm;
   wherein the rear surface of an area where the plurality of the devices are formed is ground with the grindstone to form a ring-like reinforcing portion on an outer circumferential side of the area.

2. The semiconductor wafer processing method according to claim 1,
   wherein said grindstone contains abrasive grains having a grain diameter of 0.01 μm to 0.2 μm.

3. The semiconductor wafer processing method according to claim 1, wherein the semiconductor wafer is a silicon wafer.

* * * * *